(12) United States Patent
Troost et al.

(10) Patent No.: US 7,123,348 B2
(45) Date of Patent: Oct. 17, 2006

(54) LITHOGRAPHIC APPARATUS AND METHOD UTILIZING DOSE CONTROL

(75) Inventors: Kars Zeger Troost, Waaire (NL); Arno Jan Bleeker, Westerhoven (NL)

(73) Assignee: ASML Netherlands B.V, Veldhoven (NL)

( * ) Notice: Subject to any disclaimer, the term of this patent is extended or adjusted under 35 U.S.C. 154(b) by 139 days.

(21) Appl. No.: 10/862,876

(22) Filed: Jun. 8, 2004

(65) Prior Publication Data

US 2005/0270515 A1    Dec. 8, 2005

(51) Int. Cl.
*G03B 27/54* (2006.01)
*G03B 27/72* (2006.01)

(52) U.S. Cl. .......................................... 355/67; 355/69
(58) Field of Classification Search ................. 355/67, 355/69
See application file for complete search history.

(56) References Cited

U.S. PATENT DOCUMENTS

| | | | |
|---|---|---|---|
| 5,229,872 A | | 7/1993 | Mumola |
| 5,296,891 A | | 3/1994 | Vogt et al. |
| 5,500,736 A | | 3/1996 | Koitabashi et al. |
| 5,504,504 A | * | 4/1996 | Markandey et al. ........ 345/214 |
| 5,523,193 A | | 6/1996 | Nelson |
| 5,530,482 A | | 6/1996 | Gove et al. |
| 5,579,147 A | | 11/1996 | Mori et al. |
| 5,677,703 A | | 10/1997 | Bhuva et al. |
| 5,808,797 A | | 9/1998 | Bloom et al. |
| 5,982,553 A | | 11/1999 | Bloom et al. |
| 6,133,986 A | | 10/2000 | Johnson |
| 6,177,980 B1 | | 1/2001 | Johnson |
| 6,312,134 B1 | | 11/2001 | Jain et al. |
| 6,687,041 B1 | * | 2/2004 | Sandstrom ................. 359/291 |
| 6,747,783 B1 | * | 6/2004 | Sandstrom ................. 359/290 |
| 6,795,169 B1 | | 9/2004 | Tanaka et al. |
| 6,806,897 B1 | | 10/2004 | Kataoka et al. |
| 6,811,953 B1 | | 11/2004 | Hatada et al. |
| 2004/0041104 A1 | | 3/2004 | Liebregts et al. |
| 2004/0047023 A1 | | 3/2004 | Sandstrom et al. |
| 2004/0130561 A1 | | 7/2004 | Jain |
| 2004/0239907 A1 | * | 12/2004 | Hintersteiner et al. ........ 355/67 |

(Continued)

FOREIGN PATENT DOCUMENTS

EP    0 692 728 A    1/1996

(Continued)

OTHER PUBLICATIONS

Copy of European Search Report Application No. 05252536.7-2222 mailed by European Patent Office Feb. 21, 2006 3 pages.

(Continued)

*Primary Examiner*—W. B. Perkey
*Assistant Examiner*—Vivian Nelson
(74) *Attorney, Agent, or Firm*—Sterne, Kessler, Goldstein & Fox P.L.L.C.

(57) ABSTRACT

A system and method are used to manufacture a device using at least one exposure step. Each exposure step projects a patterned beam of radiation onto a substrate. The patterned beam includes a plurality of pixels. Each pixel delivers a radiation dose no greater than a predetermined normal maximum dose to the target portion in the exposure step and/or at least one selected pixel delivers an increased radiation dose, greater than the normal maximum dose. The increased dose may be delivered to compensate for the effect of a defective element at a known position in the array on a pixel adjacent a selected pixel or compensate for underexposure of the target portion at the location of a selected pixel resulting from exposure of that location to a pixel affected by a known defective element in another exposure step.

39 Claims, 4 Drawing Sheets

U.S. PATENT DOCUMENTS

2005/0007572 A1    1/2005  George et al.
2005/0068509 A1*   3/2005  Lafypov et al. .............. 355/67

FOREIGN PATENT DOCUMENTS

WO    WO 98/33096    7/1998
WO    WO 98/38597    9/1998

OTHER PUBLICATIONS

Sanstrom T. et al. OML: Optical Maskless Lithography For Economic Design Prototyping and Small-Volume Production, Feb. 24, 2004, Proceedings of SPIE, Bellingham, VA, vol. 5377, No. 1.

* cited by examiner

LITHOGRAPHIC APPARATUS AND METHOD UTILIZING DOSE CONTROL

BACKGROUND OF THE INVENTION

1. Field of the Invention

The present invention relates to a lithographic apparatus and a device manufacturing method.

2. Related Art

A lithographic apparatus is a machine that applies a desired pattern onto a target portion of a substrate. The lithographic apparatus can be used, for example, in the manufacture of integrated circuits (ICs), flat panel displays, and other devices involving fine structures. In a conventional lithographic apparatus, a patterning means, which is alternatively referred to as a mask or a reticle, may be used to generate a circuit pattern corresponding to an individual layer of the IC (or other device), and this pattern can be imaged onto a target portion (e.g., comprising part of one or several dies) on a substrate (e.g., a silicon wafer or glass plate) that has a layer of radiation-sensitive material (e.g., resist). Instead of a mask, the patterning means may comprise an array of individually controllable elements that generate the circuit pattern.

In general, a single substrate will contain a network of adjacent target portions that are successively exposed. Known lithographic apparatus include steppers, in which each target portion is irradiated by exposing an entire pattern onto the target portion in one go, and scanners, in which each target portion is irradiated by scanning the pattern through the projection beam in a given direction (the "scanning" direction), while synchronously scanning the substrate parallel or anti-parallel to this direction.

Maskless lithography refers to lithography that uses an array of individually controllable elements instead of a mask to form a desired radiation exposure pattern on a target. The array of elements is used to pattern a radiation beam, and the patterned beam is projected onto a target surface of a substrate. The projected pattern comprises a plurality of pixels, each pixel typically corresponding to a respective one of the array of controllable elements. Generally, in such techniques, each pixel has a peak intensity that is primarily dependent upon the corresponding respective element, but which is also dependent to some degree on the elements adjacent to the corresponding element.

In a basic form of programmable array, each element may be controllable to adopt one of two states: a "black" state, in which its corresponding pixel on the projective pattern has a minimum intensity; and a "white" state, in which the corresponding pixel has maximum intensity. Thus, the array can be controlled to expose the target portion of the substrate to a desired pattern of corresponding "black" and "white" pixels, each pixel delivering a corresponding dose of radiation during the exposure step.

It is also known to use more sophisticated programmable arrays, in which each element is controllable to adopt a plurality of grey states, in addition to the black and white states. This allows pixels to deliver doses between the "white" maximum and "black" minimum. This finer dose control delivered by each pixel enables finer features to be achieved in the eventual exposure pattern.

In the art, the process of exposing the substrate target surface to a plurality of pixels is sometimes referred to as a printing step, and when an array of elements with black, white, and grey states is used, the process may be described as grey-scale printing.

In certain applications, the radiation dose pattern to which the substrate is to be exposed may be described as comprising "white" regions, defined as regions to which a dose greater than a certain value is to be delivered, and "black" regions, defined as regions to which doses smaller than a certain value are to be delivered. For example, the substrate may have a resist layer, the resist material having a certain threshold activation dose. In such cases, the white regions are those to which the delivered dose is to exceed the activation threshold, and the black regions are to receive less than the activation threshold dose, such that on subsequent development, the black regions are removed, leaving only the pattern of white regions.

When controllable element arrays are used in maskless lithography, there is a possibility that one or more of the elements may be, or may become, defective, and will be unresponsive to control signals, or will not respond in the normal, desired way. For example, a defective element may be an unresponsive element, stuck in a black or grey state. Alternatively, it maybe an element controllable to adopt only a reduced number of its normal states, so that its white state or whitest states, are inaccessible.

When no compensation is made for the defective elements, radiation doses delivered to the target substrate may be smaller than desired. "White" dead pixels may also arise, for example corresponding to elements stuck in a fully white state. "White" dead pixels cannot be corrected when intended to print "black." Therefore, all "white" dead pixels need to be made "black" before the array is used for lithography, for example, in the case of programmable mirror arrays, by mechanically deforming them to a tilted position by micromanipulation, by removing them, by creating a grating on them, or by coating the mirror black by local deposition of an absorbing material.

To produce a desired exposure pattern on a target substrate, it is known to use a two-pass maskless lithography method. In such a method, each part of the target surface is exposed to a pixel twice, i.e., two exposure steps are used to deliver, in combination, the total required radiation dose to each part of the substrate. Typically, the substrate is moved between the first and second exposure steps, relative to the beam projection system, such that a particular part of the target surface is not exposed to the same pixel twice (i.e., a pixel corresponding to the same controllable element). This has been done to limit the maximum effect that a defective pixel can have. Also, even if no defective elements are present on the array, a two-pass system enables an improved total dose accuracy to be achieved compared with a single exposure method.

To produce a desired exposure pattern of "white" and "black" regions on a target surface of a resist layer of a substrate, a two-pass system is typically arranged such that in each exposure step a fully white pixel delivers a radiation dose just greater than half the resist activation threshold dose. This is achieved by appropriate selection of exposure time (i.e., the time for which the substrate is exposed to a particular pixel in each exposure step) and the intensity of the radiation source.

Previous systems tried to use as short exposure times as possible, which increases pixel printing rate, and hence improves throughput, but this is limited by the switching speeds of the controllable elements (i.e., how fast they can be controlled to switch from one state to another). Previous systems also tried to use a radiation source whose output power is no higher than necessary. This is because, generally, the higher the source power the higher its cost, and the higher the cost of the beam conditioning, transport, and projection systems required to accommodate the beam. In addition, higher beam intensity can lead to an increased rate of degradation of certain components. Thus, in previous systems, the general requirement has been that the projected beam should interact with a fully "white" element to produce a corresponding "white" pixel, which delivers the required dose in the in particular exposure period, i.e., a dose just greater than half the resist threshold dose.

To make best use of available source power, prior art methods have been arranged to print the "white" regions of the target with elements set to their fully "white" states.

Thus, in general, in a typical two-pass method, "white" regions of the target have been printed using "white" pixels of maximum, 100% intensity (i.e., the maximum achievable intensity with the particular radiation source and range of element states), and "grey" and "black" pixels, with intensities down to 0% have also been used to build up the desired dosage pattern.

In such methods, problems occur if an element is completely unresponsive and set in a "black" state, or is otherwise unable to interact with the source beam to make a contribution to its corresponding pixel. In other words, if the element is a "black dead element" and its corresponding pixel is a "black dead pixel." If, for example, the "black" dead pixel falls on a "white" region of the target surface, then instead of delivering the required dose (e.g., approximately half the threshold dose) in a first pass it will deliver a much reduced dose, even a zero dose. Even though the part of the "white" region upon which the "black" dead pixel falls may be exposed to a full, 100% intensity "white" pixel in the second pass (e.g., corresponding to a non-defective element in the same element array, or a non-defective element in another array), the combined dose it receives may thus fall significantly short of the threshold dose required.

Clearly, such under exposure resulting from defective elements has a detrimental effect on the dosage pattern achieved by the process. It will be appreciated that similar problems also occur if, rather than being completely "black," a defective element is set in a "grey" state and is unable to deliver, via its corresponding pixel, a sufficiently high dosage in one of the passes.

Figure 2:
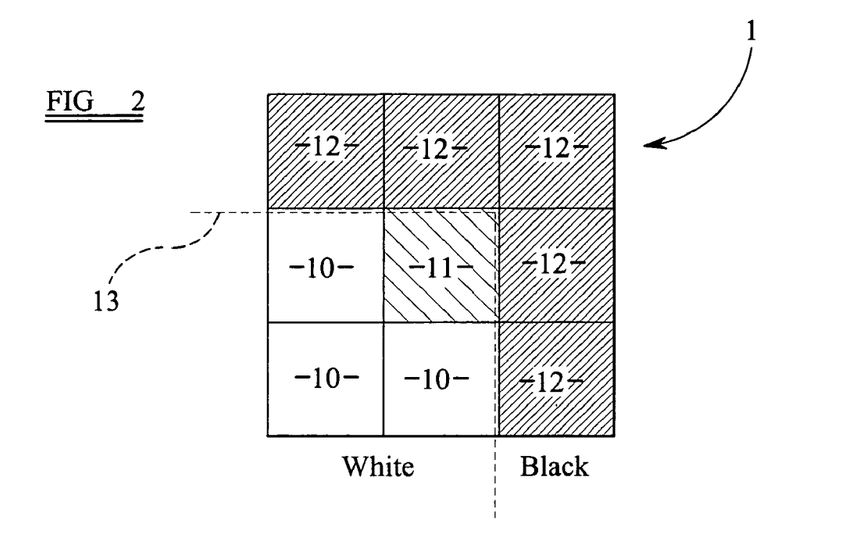
FIG. 2 illustrates a defective pixel compensation method.

One previous attempt to compensate for a dead black pixel is illustrated in FIG. 2. Here, a simplified projected pattern 1 of nine pixels is shown, falling on a corner of a white region of a target surface. The boundary of the white region is indicated by broken line 13. Pixels 10, 11 falling on the white region are intended to be fully white (i.e., to print at full intensity), and pixels 12 falling on the black region are intended to be fully black (i.e., zero intensity). However, pixel 11 is a dead black pixel.

To compensate for this, rather than being fully black, non-white pixels 12 neighboring dead black pixel 11 are made grey, such that their contributions to the radiation dosage delivered by pixel 11 combine to compensate at least partially for the dosage lost as a result of the defective element. Thus, the neighboring black pixels in the same exposure step (e.g., write pass) have been used to compensate for a dead black pixel 11 falling on the edge of a white region, and it is also known to use neighboring (i.e., surrounding) black pixels to provide such compensation in a preceding or subsequent pass.

A problem with this compensation method, however, is that by increasing the intensities of pixels 12 from black to grey values, the positions of the feature edges between the black and non-defective white pixels may be undesirably shifted, and once a black region has been given a grey dosage, it is not possible to reverse this. Correcting with neighboring pixels in this way leads not only (and necessarily) to a shift of the edge position, it also makes the edge less steep. The (N)ILS (which is the (normalized) imaging log slope) gets worse. Also, if the dead black pixel falls on a line edge, rather than at a corner, the number of immediately adjacent black pixels for compensation purposes is reduced. Furthermore, if a dead black pixel falls within a white region such that it is surrounded by non-defective white pixels, the above technique can provide no compensation.

Another attempt to solve the problem of underexposure resulting from defective elements/pixels has been to use an additional write pass, which may be referred to as a "clean-up pulse" or exposure. Here, the substrate is moved with respect to the projection system such that no part of the substrate can be exposed to the same defective pixel twice. The clean-up pass is made specifically to deliver targeted radiation doses to selected parts of the substrate which received lower than their desired doses in the preceding exposure step or steps. Although good compensation may be achieved, the problem with this technique is that the need for an additional write pass reduces throughput, or increases costs and complexity if it is achieved by adding further arrays of controllable elements to those normally required for printing.

Although two-pass systems have been described, it will be appreciated that problems of defective elements occur also in single pass methods, and multiple-pass methods using three or more passes to achieve required radiation dosage patterns.

Thus, there remain problems associated with the compensation for effects of defective elements in maskless lithography.

Therefore, what is needed is lithographic methods and apparatus that allow for more efficient and effective compensation for effects of defective elements in maskless lithography.

SUMMARY OF THE INVENTION

According to an embodiment of the invention, there is provided a device manufacturing method comprising the steps of providing a projection beam of radiation using an illumination system, using an array of individually controllable elements to impart the projection beam with a pattern in its cross-section, projecting the patterned beam of radiation onto a target portion of a substrate, wherein the projected radiation pattern comprises a plurality of pixels, such that no compensation for defective elements is required. The elements are controlled such that each pixel delivers a radiation dose no greater than a predetermined normal maximum dose to the target portion in the exposure step. When compensation for defective elements is required, the method controls the elements such that at least one selected pixel delivers an increased radiation dose, greater than the normal maximum dose, in the exposure step. This compensates at least partially for at least one of: (a) the effect, in the same exposure step, of a defective element, at a known position in the array, on a pixel adjacent a selected pixel and (b) an underexposure of the target portion at the location of a selected pixel resulting from exposure of the location to a pixel affected by a known defective element in another (i.e., a different) exposure step. The step of exceptionally controlling the elements may also be described as a compensation step.

As discussed above, conventional compensation methods were limited to using compensation doses up to the normal printing maximum, i.e., the dose provided by a fully-white, non-defective pixel in a single exposure step/write pass. Thus, compensation was limited to increasing the dose delivered by selected pixels in the projected pattern that would otherwise have been black or grey.

In contrast, according to this embodiment of the present invention, doses up to the predetermined normal maximum for normal printing are used, but the method reserves at least one increased dose for compensation purposes. This can allow for that nominal white pixels in the projected radiation pattern to be used for compensation purposes. Thus, even when a dead black pixel falls in the middle of a group of surrounding white pixels it can be compensated, in the same exposure step, by increasing the radiation dose delivered by one or more of those neighboring white pixels, above the normal fully white value. This may conveniently be achieved by reserving one or more of the elements' most intense states (i.e., the states in which they interact with the projected beam to make the greatest contributions to their pixel's intensities) only for compensation purposes, the lower intensity states being used for normal printing.

In a multi-pass (i.e., a multiple exposure step) example, an increased dose may be delivered in one step to a location that has been underexposed in a previous step, or that will receive a reduced dose in a subsequent pass as a result of being exposed to the pixel corresponding to a known defective element. The increased dose may, in certain embodiments, be large enough to completely compensate, in a single step, for any degree of underexposure in another step. Compensation for the effects, in a particular step, of a defective pixel in the same step, is not then required.

In general, in a multi-step method, as much compensation as possible is made in each step for the effects of defective elements in that step using adjacent pixels. This reduces the amount of compensation to be provided by the other step or steps.

Compensation in the same exposure step, using adjacent pixels, may conveniently be referred to as simultaneous compensation, whilst compensation in preceding and subsequent steps may be referred to as pre-compensation and post-compensation respectively.

Compared with conventional methods, if the above embodiment produces the same final radiation dosage pattern on a substrate in the same time with the same number of passes/exposure steps, then it may employ an illumination system that delivers a more intense beam. The increased intensity is required to provide the capacity to deliver the radiation doses above the normal printing maximum. Although there are consequential increases in cost, significant improvements to the pattern quality are achieved as a result of the ability to compensate with white pixels, and a further advantage is the avoidance of an additional clean-up pass, which would reduce throughput.

In one example, an increased radiation dose deliverable in a compensation step is larger than the normal maximum dose by a factor of up to at least about 1.1, 1.5, or even 2. In the last case, in a two-pass system, a compensation dose in one exposure step can provide complete compensation for a zero dose, rather than a normal white dose, being delivered by a dead black pixel in the other pass. If the maximum increased dose is less than twice the normal maximum dose then some simultaneous compensation is required, in addition to pre- or post-compensation for full compensation.

Typically, a substrate will have a target surface to which a predetermined radiation dosage pattern is to be delivered. In this example, the dosage pattern comprises nominal white regions, to which a radiation dosage at least equal to a predetermined threshold value is to be delivered, and nominal black regions, to which a radiation dosage less than the predetermined threshold value is to be delivered. The step of ordinarily controlling the elements (i.e., the normal printing step) will then comprise controlling the elements such that each pixel projected onto (i.e., falling on) a white region delivers a radiation dose no greater than the predetermined normal maximum dose in the exposure step. The compensation step then comprises controlling the elements such that each of the selected pixels is projected onto a white region and delivers an increased radiation dose to that white region. In other words, compensation involves the white regions selectively being given overdoses, above the normal white printing threshold. A pixel falling on a white region may thus be selected to deliver an increased dose, of calculated magnitude, to compensate for an adjacent dead pixel falling on the same white region in the same exposure step. Alternatively, or additionally, a pixel may be selected to deliver an increased dose to a white region at a location underexposed by a defective pixel in a preceding or subsequent exposure step.

In one example, a substrate may comprise a layer of radiation sensitive material (e.g., resist) having an activation threshold, and the predetermined threshold value may be equal to that activation threshold. In such instances, the target surface is a surface of the layer. For a single-pass example, the normal maximum dose is arranged so as to be greater than the predetermined threshold value. For a multi-pass example, the normal maximum dose may be less than the predetermined threshold value and greater than half the predetermined threshold value.

In one example, the method may comprise two of the exposure steps, the two exposure steps combining to deliver the predetermined radiation dosage pattern to a common target portion of the target surface. The same array of elements may be used in each step, but with different sets of pixels, corresponding to different sets of the controllable elements, being used to expose the common target portion. Alternatively, different arrays may be used. As described above, each exposure step may comprise substantially simultaneous compensation for the effects of defective elements on that step. Additionally, or alternatively, the first exposure step may comprise a pre-compensation step for underexposure in the second exposure step, and the second exposure step may comprise post-compensation for underexposure effects in the first exposure step.

In one example, each pixel in the projected radiation pattern corresponds to a respective one of the elements of the array. Thus, the step of exceptionally controlling the elements may comprise controlling selected elements such that their corresponding pixels deliver increased radiation doses.

In one example, the array of elements includes a defective element at a known position. In this example, the compensation step may comprise controlling one or more elements immediately adjacent the defective element such that their corresponding pixels, immediately adjacent the defective pixel (i.e. the pixel corresponding to the defective element), deliver increased radiation doses. Thus, when a defective pixel falls on a white region, its effect may be compensated by controlling elements surrounding the defective element such that surrounding pixels, which fall on the same white region, deliver increased doses.

It will be appreciated that, for substantially simultaneous compensation to be provided, each pixel in the projected radiation pattern will have an intensity distribution primarily dependent on a respective corresponding element but also dependent on elements immediately adjacent the respective corresponding element in the array.

In various examples, dose control may be achieved in a variety of ways. For example, pixel intensity may be adjusted by controlling element states and/or by controlling projection beam intensity (e.g., by adjusting laser pulse height, given a certain pulse length, such as 10–30 ns, when the projection beam is provided by a pulsed laser source). Alternatively, pixel duration may be adjusted, for example by adjusting laser pulse length.

In one example, control of the radiation doses delivered by each pixel is achieved by controlling (adjusting) pixel intensity. Thus, the step of ordinarily controlling the elements may comprise controlling the elements such that each pixel has a peak intensity no higher than a predetermined normal maximum intensity, and the step of exceptionally controlling the elements may comprise controlling the elements such that each selected pixel has an increased peak intensity, higher than the normal maximum intensity. The increased peak intensity may be higher than the normal maximum intensity by up to at least a factor of about 1.1, 1.5, or even 2, such that an intensity "headroom" of 100–200% is reserved for compensation purposes, above the 0–100% used for normal printing.

In one example, arrays of elements are used in which each element, when not defective, is controllable to selectively adopt one of at least three states. These states comprising: (a) a nominal black state, in which the element interacts with the projection beam so as to make a minimum contribution to the radiation dose delivered by a corresponding pixel; (b) at least one nominal grey state, in which the element interacts with the projection beam so as to make an increased contribution to the radiation dose delivered by the corresponding pixel; and (c) at least one nominal white state, in which the element interacts with the projection beam so as to make a contribution to the radiation dose delivered to the corresponding pixel greater than that in any grey state. Normal printing is then performed using elements set in the black or grey states, and compensation is performed using elements in white states.

In one example, controllable arrays, such as programmable mirror arrays, are used in which each mirror element is controllable to adopt a range of tilt angles, such that the state of an element can be used to determine the dosage delivered by a corresponding pixel by affecting the intensity of that pixel.

Although a method embodying the invention may be carried out using elements which have a single black state, a single grey state, and a single white state, each non-defective element can also be controllable to selectively adopt one of a series of grey states and a series of white states, each grey or white state corresponding to a respective contribution to a corresponding pixel's peak intensity. The grey and white states may form a discrete or a continuous series. Preferably, each non-defective element may be controllable to adopt as many as 64 states, or more, to enable greyscale printing to be achieved. Hence, independence between the position of the projected radiation pattern and the "grid" defined by the array of controllable elements may be achieved.

In one example, the series of white states includes a whitest state in which the element interacts with the beam to provide a maximum contribution to the peak intensity of the corresponding pixel, the maximum contribution being at least twice as large as the largest contribution corresponding to a grey state. In other words, an element in the whitest state may provide a pixel having twice the intensity as that of a pixel corresponding to an element in the most intense grey state.

In this example, the black and grey states together form a first set of states, used for normal beam patterning and exposure of the target surface of the substrate, and the white states form a second set of states, reserved for use in compensating for the effects of defective elements in the current exposure step or in previous or subsequent exposure steps. Reserving the second set of states in this way provides exposure headroom.

Another embodiment of the present invention provides a lithographic apparatus comprising an illumination system for supplying a projection beam of radiation, an array of individually controllable elements serving to impart the projection beam with a pattern in its cross-section, a controller arranged to control the elements, a substrate table for supporting a substrate, and a projection system for projecting the patterned beam onto a target portion of the substrate. The projected radiation pattern comprises a plurality of pixels, each pixel delivering a respective radiation dose to the target portion. Each element, when not defective, is controllable to selectively adopt one of at least three states. The states comprise: (a) a nominal black state, in which the element interacts with the projection beam so as to make a minimum contribution to the radiation dose delivered by a corresponding pixel; (b) at least one nominal grey state, in which the element interacts with the projection beam so as to make an increased contribution to the radiation dose delivered by the corresponding pixel; and (c) at least one nominal white state, in which the element interacts with the projection beam so as to make a contribution to the radiation dose delivered to the corresponding pixel greater than that in any grey state. The controller is arranged ordinarily to control the elements such that each element adopts one of the black or grey states. The controller is further arranged to selectively control the elements to adopt white states to provide compensation for the effects of defective pixels.

In this embodiment, the controller is arranged to use the black and grey states for ordinary, normal substrate exposure, and to reserve the white states for compensation purposes, i.e. only uses them when a defective element has affected, is affecting, or will be affecting the dose pattern delivered. Each non-defective element is controllable to selectively adopt one of a series of grey states, and one of a series of white states, and the elements may conveniently be provided by a programmable mirror array.

In one example, there is a lithographic apparatus in combination with a substrate having a target surface to which a predetermined radiation dosage pattern is to be delivered. The dosage pattern comprises nominal white regions, to which a radiation dosage at least equal to a predetermined threshold value is to be delivered, and nominal black regions, to which a radiation dosage less than the predetermined threshold value is to be delivered. The series of grey states may then include a maximum grey state in which the increased contribution is a maximum for the grey states. The illumination system and controller being arranged to expose the target portion to each pixel for a common exposure time, and the illumination system and elements being arranged such that exposure of the target portion for the common exposure time to a pixel whose corresponding element is in the maximum gray state delivers a dose at least equal to the predetermined threshold value. Alternatively, exposure of the target portion for the common exposure time to a pixel whose corresponding element is in the maximum gray state may be arranged to deliver a dose less than the predetermined threshold value but greater than half the predetermined threshold value.

The above embodiments can allow for better CD (charge dosage) control than with uncorrected dead pixels or than with conventional correction methods using surrounding pixels limited to 100% normal whiteness only.

The above embodiment can be described as providing the capability to print "whiter-than-white" for correction purposes.

Another embodiment can prevent a third pass being needed to print a missed dose in a clean-up scheme, and hence avoid the consequential reduction in throughput when using the same number of controllable element arrays (33%) or the additional cost for the element arrays, associated electronics, and wider projector field that would result if an additional element row were needed to provide clean-up doses.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

The present invention will now be described with reference to the accompanying drawings. In the drawings, like reference numbers may indicate identical or functionally similar elements.

DETAILED DESCRIPTION OF THE EMBODIMENTS

Overview and Terminology

In one embodiment of the present invention using a microlens array imaging system, it is the function of a field lens of a beam expander (which field lens may be formed from two or more separate lenses) in an illumination system to make a projection system telecentric by ensuring that all components of the light beam between the field lens and the microlens array are parallel and perpendicular to the microlens array. However, although light beams between the field lens and the microlens array may be substantially parallel, absolute parallelism may not be achievable.

Thus, given a degree of non-telecentricity in the projection system, according to one embodiment of the present invention, small magnification adjustments can be achieved without undue loss of focus by displacing one or more of the lens components which are located between the pupil and the substrate table.

In one embodiment, a projection system will define a pupil. The term "pupil" being used in this document to refer to a plane where rays of the projection beam intersect which rays leave the patterning system from different locations relative to the patterning system but at the same angle relative to an axis of the projection beam which is normal to the patterning system.

For example, according to one embodiment of the present invention, assuming a microlens imaging system in which the field lens is initially arranged to generate a perfectly parallel beam of radiation between itself and the array of lenses. Also, assume that light reaching the field lens is diverging. Any displacement of the field lens away from the microlens array will result in the projection beam becoming slightly divergent, whereas displacement of the field lens towards the microlens array will result in the projection beam becoming slightly convergent. Given however that the field lens is a relatively weak lens, displacements necessary to change the magnification of the projection system to compensate for distortions of the substrate (typically of the order of parts per million) can be achieved without affecting the focus of the projection beam on the substrate surface to an unacceptable extent. Although focus change due to displacement of the microlens array towards or away from the substrate is a first order effect, and resultant changes in magnification on a second order effect, nevertheless useful magnification adjustment may be made.

In this embodiment, the field lens may be made up of a single or two or more lenses. Each field lens may be simply moved in translation either towards or away from the microlens array, or the field lens may be tilted so as to result in a differential change in magnification across the surface of the exposed substrate. Similarly, the microlens array may be moved in translation and/or tilted.

The term "array of individually controllable elements" as here employed should be broadly interpreted as referring to any device that can be used to endow an incoming radiation beam with a patterned cross-section, so that a desired pattern can be created in a target portion of the substrate. The terms "light valve" and "Spatial Light Modulator" (SLM) can also be used in this context. Examples of such patterning devices are discussed below.

A programmable mirror array may comprise a matrix-addressable surface having a viscoelastic control layer and a reflective surface. The basic principle behind such an apparatus is that, for example, addressed areas of the reflective surface reflect incident light as diffracted light, whereas unaddressed areas reflect incident light as undiffracted light. Using an appropriate spatial filter, the undiffracted light can be filtered out of the reflected beam, leaving only the diffracted light to reach the substrate. In this manner, the beam becomes patterned according to the addressing pattern of the matrix-addressable surface.

It will be appreciated that, as an alternative, the filter may filter out the diffracted light, leaving the undiffracted light to reach the substrate. An array of diffractive optical micro electrical mechanical system (MEMS) devices can also be used in a corresponding manner. Each diffractive optical MEMS device can include a plurality of reflective ribbons that can be deformed relative to one another to form a grating that reflects incident light as diffracted light.

A further alternative embodiment can include a programmable mirror array employing a matrix arrangement of tiny mirrors, each of which can be individually tilted about an axis by applying a suitable localized electric field, or by employing piezoelectric actuation means. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means.

In both of the situations described here above, the array of individually controllable elements can comprise one or more programmable mirror arrays. More information on mirror arrays as here referred to can be gleaned, for example, from U.S. Pat. Nos. 5,296,891 and 5,523,193, and PCT patent applications WO 98/38597 and WO 98/33096, which are incorporated herein by reference in their entireties.

A programmable LCD array can also be used. An example of such a construction is given in U.S. Pat. No. 5,229,872, which is incorporated herein by reference in its entirety.

It should be appreciated that where pre-biasing of features, optical proximity correction features, phase variation techniques and multiple exposure techniques are used, for example, the pattern "displayed" on the array of individually controllable elements may differ substantially from the pattern eventually transferred to a layer of or on the substrate. Similarly, the pattern eventually generated on the substrate may not correspond to the pattern formed at any one instant on the array of individually controllable elements. This may be the case in an arrangement in which the eventual pattern formed on each part of the substrate is built up over a given period of time or a given number of exposures during which the pattern on the array of individually controllable elements and/or the relative position of the substrate changes.

Although specific reference may be made in this text to the use of lithographic apparatus in the manufacture of ICs, it should be understood that the lithographic apparatus described herein may have other applications, such as, for example, the manufacture of DNA chips, MEMS, MOEMS, integrated optical systems, guidance and detection patterns for magnetic domain memories, flat panel displays, thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5–20 nm), as well as particle beams, such as ion beams or electron beams.

The term "projection system" used herein should be broadly interpreted as encompassing various types of projection systems, including refractive optical systems, reflective optical systems, and catadioptric optical systems, as appropriate, for example, for the exposure radiation being used, or for other factors such as the use of an immersion fluid or the use of a vacuum. Any use of the term "lens" herein may be considered as synonymous with the more general term "projection system."

The illumination system may also encompass various types of optical components, including refractive, reflective, and catadioptric optical components for directing, shaping, or controlling the projection beam of radiation, and such components may also be referred to below, collectively or singularly, as a "lens."

The lithographic apparatus may be of a type having two (e.g., dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index (e.g., water), so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

Further, the apparatus may be provided with a fluid processing cell to allow interactions between a fluid and irradiated parts of the substrate (e.g., to selectively attach chemicals to the substrate or to selectively modify the surface structure of the substrate).

Lithographic Projection Apparatus

Figure 1:
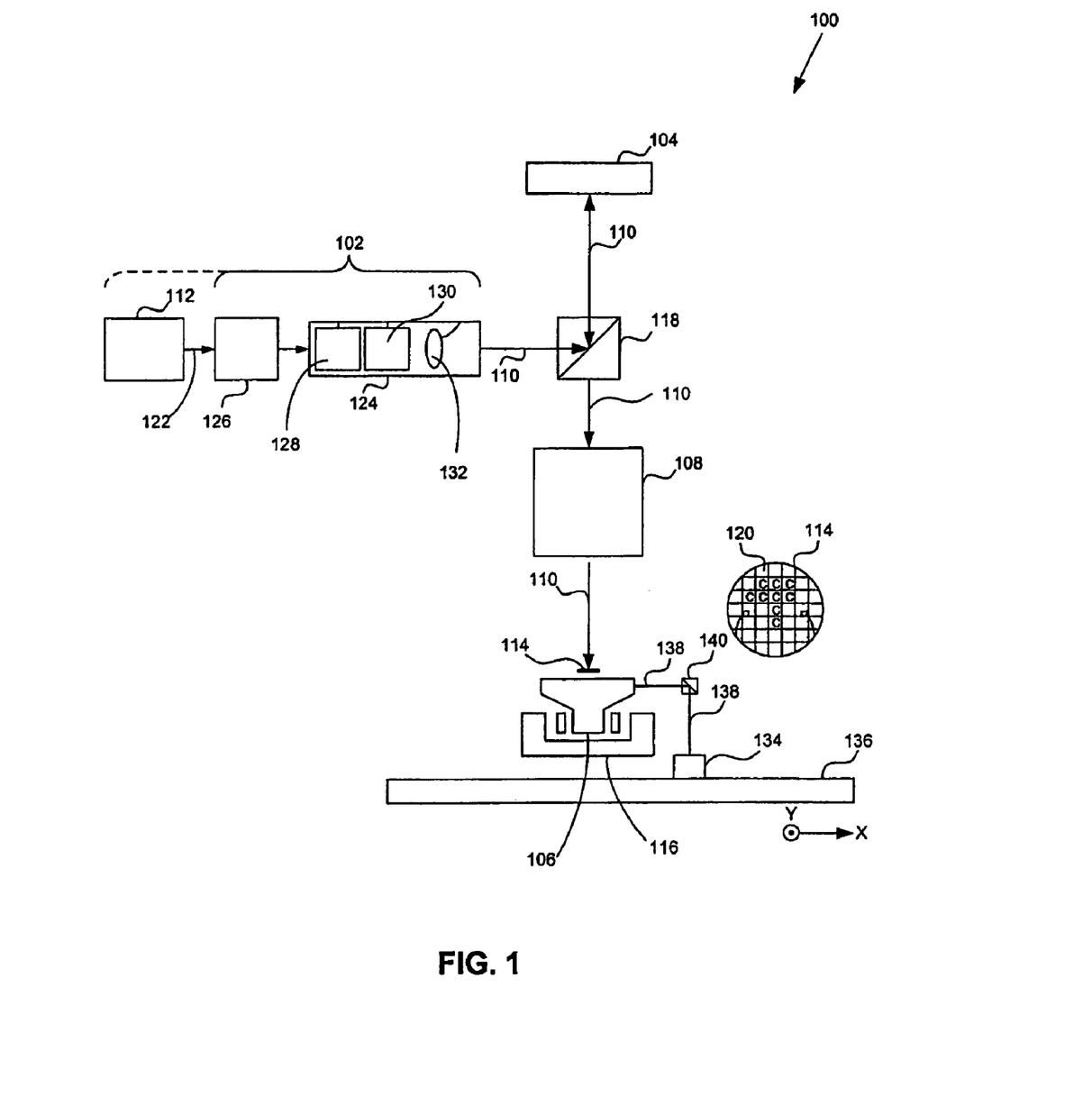
FIG. 1 depicts a lithographic apparatus, according to one embodiment of the invention.

FIG. 1 schematically depicts a lithographic projection apparatus 100 according to an embodiment of the invention. Apparatus 100 includes at least a radiation system 102, an array of individually controllable elements 104, an object table 106 (e.g., a substrate table), and a projection system ("lens") 108.

Radiation system 102 can be used for supplying a projection beam 110 of radiation (e.g., UV radiation), which in this particular case also comprises a radiation source 112.

An array of individually controllable elements 104 (e.g., a programmable mirror array) can be used for applying a pattern to projection beam 110. In general, the position of the array of individually controllable elements 104 can be fixed relative to projection system 108. However, in an alternative arrangement, an array of individually controllable elements 104 may be connected to a positioning device (not shown) for accurately positioning it with respect to projection system 108. As here depicted, individually controllable elements 104 are of a reflective type (e.g., have a reflective array of individually controllable elements).

Object table 106 can be provided with a substrate holder (not specifically shown) for holding a substrate 114 (e.g., a resist coated silicon wafer or glass substrate) and object table 106 can be connected to a positioning device 116 for accurately positioning substrate 114 with respect to projection system 108.

Projection system 108 (e.g., a quartz and/or CaF2 lens system or a catadioptric system comprising lens elements made from such materials, or a mirror system) can be used for projecting the patterned beam received from a beam splitter 118 onto a target portion 120 (e.g., one or more dies) of substrate 114. Projection system 108 may project an image of the array of individually controllable elements 104 onto substrate 114. Alternatively, projection system 108 may project images of secondary sources for which the elements of the array of individually controllable elements 104 act as shutters. Projection system 108 may also comprise a micro lens array (MLA) to form the secondary sources and to project microspots onto substrate 114.

Source 112 (e.g., an excimer laser) can produce a beam of radiation 122. Beam 122 is fed into an illumination system (illuminator) 124, either directly or after having traversed conditioning device 126, such as a beam expander 126, for example. Illuminator 124 may comprise an adjusting device 128 for setting the outer and/or inner radial extent (commonly referred to as σ-outer and σ-inner, respectively) of the intensity distribution in beam 122. In addition, illuminator 124 will generally include various other components, such as an integrator 130 and a condenser 132. In this way, projection beam 110 impinging on the array of individually controllable elements 104 has a desired uniformity and intensity distribution in its cross section.

It should be noted, with regard to FIG. 1, that source 112 may be within the housing of lithographic projection apparatus 100 (as is often the case when source 112 is a mercury lamp, for example). In alternative embodiments, source 112 may also be remote from lithographic projection apparatus 100. In this case, radiation beam 122 would be directed into apparatus 100 (e.g., with the aid of suitable directing mirrors). This latter scenario is often the case when source 112 is an excimer laser. It is to be appreciated that both of these scenarios are contemplated within the scope of the present invention.

Beam 110 subsequently intercepts the array of individually controllable elements 104 after being directing using beam splitter 118. Having been reflected by the array of individually controllable elements 104, beam 110 passes through projection system 108, which focuses beam 110 onto a target portion 120 of the substrate 114.

With the aid of positioning device 116 (and optionally interferometric measuring device 134 on a base plate 136 that receives interferometric beams 138 via beam splitter 140), substrate table 106 can be moved accurately, so as to position different target portions 120 in the path of beam 110. Where used, the positioning device for the array of individually controllable elements 104 can be used to accurately correct the position of the array of individually controllable elements 104 with respect to the path of beam 110, e.g., during a scan. In general, movement of object table 106 is realized with the aid of a long-stroke module (course positioning) and a short-stroke module (fine positioning), which are not explicitly depicted in FIG. 1. A similar system may also be used to position the array of individually controllable elements 104. It will be appreciated that projection beam 110 may alternatively/additionally be moveable, while object table 106 and/or the array of individually controllable elements 104 may have a fixed position to provide the required relative movement.

In an alternative configuration of the embodiment, substrate table 106 may be fixed, with substrate 114 being moveable over substrate table 106. Where this is done, substrate table 106 is provided with a multitude of openings on a flat uppermost surface, gas being fed through the openings to provide a gas cushion which is capable of supporting substrate 114. This is conventionally referred to as an air bearing arrangement. Substrate 114 is moved over substrate table 106 using one or more actuators (not shown), which are capable of accurately positioning substrate 114 with respect to the path of beam 110. Alternatively, substrate 114 may be moved over substrate table 106 by selectively starting and stopping the passage of gas through the openings.

Although lithography apparatus 100 according to the invention is herein described as being for exposing a resist on a substrate, it will be appreciated that the invention is not limited to this use and apparatus 100 may be used to project a patterned projection beam 110 for use in resistless lithography.

The depicted apparatus 100 can be used in four preferred modes:

1. Step mode: the entire pattern on the array of individually controllable elements 104 is projected in one go (i.e., a single "flash") onto a target portion 120. Substrate table 106 is then moved in the x and/or y directions to a different position for a different target portion 120 to be irradiated by patterned projection beam 110.

2. Scan mode: essentially the same as step mode, except that a given target portion 120 is not exposed in a single "flash." Instead, the array of individually controllable elements 104 is movable in a given direction (the so-called "scan direction", e.g., the y direction) with a speed v, so that patterned projection beam 110 is caused to scan over the array of individually controllable elements 104. Concurrently, substrate table 106 is simultaneously moved in the same or opposite direction at a speed V=Mv, in which M is the magnification of projection system 108. In this manner, a relatively large target portion 120 can be exposed, without having to compromise on resolution.

3. Pulse mode: the array of individually controllable elements 104 is kept essentially stationary and the entire pattern is projected onto a target portion 120 of substrate 114 using pulsed radiation system 102. Substrate table 106 is moved with an essentially constant speed such that patterned projection beam 110 is caused to scan a line across substrate 106. The pattern on the array of individually controllable elements 104 is updated as required between pulses of radiation system 102 and the pulses are timed such that successive target portions 120 are exposed at the required locations on substrate 114. Consequently, patterned projection beam 110 can scan across substrate 114 to expose the complete pattern for a strip of substrate 114. The process is repeated until complete substrate 114 has been exposed line by line.

4. Continuous scan mode: essentially the same as pulse mode except that a substantially constant radiation system 102 is used and the pattern on the array of individually controllable elements 104 is updated as patterned projection beam 110 scans across substrate 114 and exposes it.

Combinations and/or variations on the above described modes of use or entirely different modes of use may also be employed.

In the embodiment shown in FIG. 1, array of individually controllable elements 104 is a programmable mirror array. Programmable mirror array 104, comprises a matrix arrangement of tiny mirrors, each of which can be individually tilted about an axis. The degree of tilt defines the state of each mirror. The mirrors are controllable, when the element is not defective, by appropriate control signals from the controller. Each non-defective element is controllable to adopt any one of a series of states, so as to adjust the intensity of its corresponding pixel in the projected radiation pattern.

In one example, the series of states includes: (a) a black state in which radiation reflected by the mirror makes a minimum, or even a zero contribution to the intensity distribution of its corresponding pixel; (b) a whitest state in which the reflected radiation makes a maximum contribution; and (c) a plurality of states in between in which the reflected radiation makes intermediate contributions. The states are divided into a normal set, used for normal beam patterning/printing, and a compensation set, used for compensating for the effects of defective elements. The normal set comprises the black state and a first group of the intermediate states. This first group will be described as grey states, and they are selectable to provide progressively increasing contributions to corresponding pixel intensity from the minimum black value up to a certain normal maximum. The compensation set comprises the remaining, second group of intermediate states together with the whitest state. This second group of intermediate states will be described as white states, and they are selectable to provide contributions greater than the normal maximum, progressively increasing up to the true maximum corresponding to the whitest state. Although the second group of intermediate states are being described as white states, it will be appreciated that this is simply to facilitate the distinction between the normal and compensatory exposure steps. The entire plurality of states could alternatively be described as a sequence of grey states, between black and white, selectable to enable grey-scale printing.

Exemplary Operation

Figure 6:
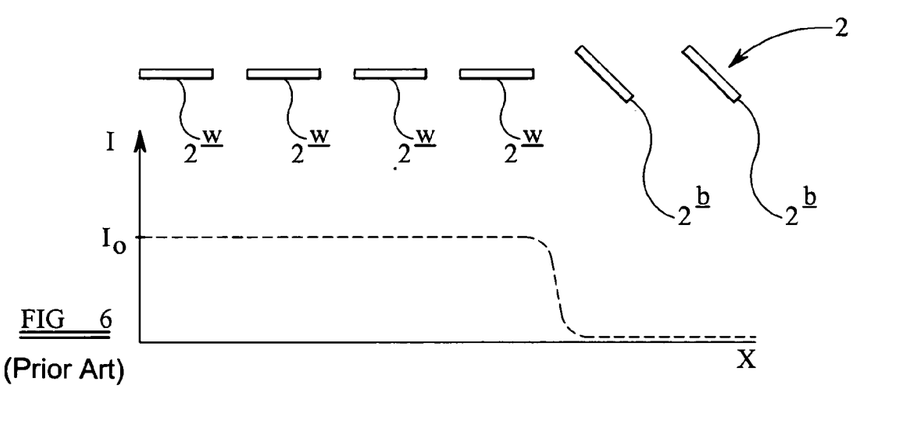
FIG. 6 illustrates part of an array of elements and the corresponding intensity pattern produced on a target substrate in a lithographic method.

FIG. 6 shows an arrangement of a conventional lithographic system and method, in which a row of controllable elements 2 is used to project a pixel pattern onto a substrate. The elements are small mirrors whose tilt angles may be adjusted by appropriate control signals. The upper part of FIG. 6 shows four of mirrors 2$w$ in their whitest states, and two of mirrors 2$b$ tilted into their black states. The lower part of FIG. 6 shows, in highly simplified form, the intensity distribution along a line on the target substrate through the centers of the pixels corresponding to the row of elements 2. As can be seen, the intensities of the pixels corresponding to white elements 2$w$ (w=white) are at a maximum value $I_0$, and the intensities of the pixels corresponding to black elements 2$b$ (b=black) are substantially zero. The pixels having intensity $I_0$ are projected onto a white region of the target, with the transition to black pixels being arranged at the white region edge. Thus, in this conventional method, the whitest possible (e.g., most intense) element states are used for normal exposure of white regions.

Figure 7:
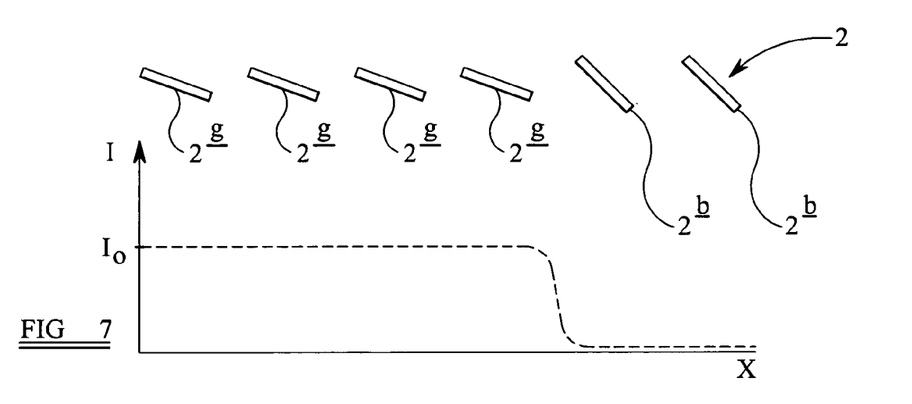
FIG. 7 illustrates part of an array of elements and the corresponding intensity pattern produced on a target substrate in a lithographic according to one embodiment of the present invention.
Figure 8:
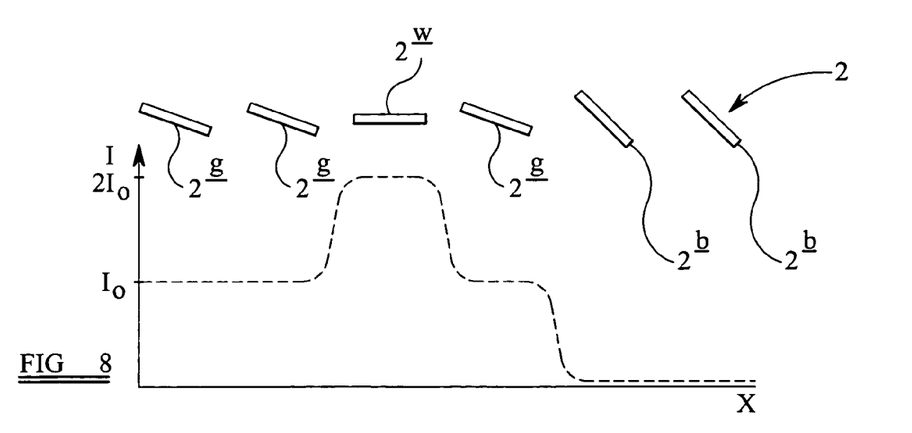
FIG. 8 illustrates part of an array of elements and the corresponding intensity pattern produced on a target substrate in a lithographic method including a compensation step according to one embodiment of the present invention.

FIG. 7 shows a first state of operation of lithographic apparatus 100 according to one embodiment of the present invention, while FIG. 8 shows a second state of operation of lithographic apparatus 100 according to the embodiment of the present invention. For example, FIG. 7 shows part of a normal exposure step (i.e., normal printing), while FIG. 8 illustrates a combination of normal and exceptional control of the elements to expose a substrate and provide compensation.

In contrast to FIG. 6, FIG. 7 shows a row of elements 2 of the programmable mirror array of the apparatus of FIG. 1, used to perform normal substrate exposure (i.e. when no compensation for defective elements is required) in a method embodying the invention. Here, elements 2$g$ (g=gray) whose pixels fall on a white region of the substrate are in one of their grey states. However, a radiation source of sufficient power is being used such that, even with their corresponding elements in these grey, reduced intensity states, the pixels falling on the white region still have intensity $I_0$. Elements 2$b$ whose pixels fall on the black region of the substrate are set in their black states. Thus, the controller of the apparatus of FIG. 1 is arranged to control the elements such that white regions of the target are normally exposed to pixels whose corresponding elements are set in grey, not white, states.

By normally printing with grey pixels, an intensity headroom window of 100–200% may be reserved, on top of the 0–100% used for normal printing. Thus, the apparatus of FIG. 1, with suitably arranged controller, can be used to add the intensity missed by a black dead pixel (which was intended to print at full, normal white intensity) in a previous, or subsequent exposure step. This compensation may conveniently be achieved when subsequent pixel patterns overlap pixel-to-pixel.

FIG. 8 shows the row of elements 2 from FIG. 7 again being used to print a white feature edge. This time, however, part of the white region received a zero dose in a preceding exposure dose, as a result of exposure to a dead black pixel. Thus, while three of the elements 2$g$ are being normally controlled, to adopt a grey state appropriate to normal white printing, a selected element 2$w$ has been set to its whitest state, such that its corresponding pixel has intensity 2$I_0$.

In one example, fine positioning of the projected radiation pattern may be achieved by grey scaling, which allows for independence from the grid of mirrors.

In one example, non-defective elements may be controllable to achieve a number, e.g. 64, of grey levels for each pixel. In this example, the control system allows as close an approach as possible to the intended grey-level of the "dead" pixel.

An example of how "off-grid" printing can be achieved is as follows. A "white" line, two pixels wide, can be printed on-grid by setting a series of six pixels to the following states: B B W W B B (where B=black, W=white, and the series of six pixels runs across the printed line). To print a two-pixel-wide line exactly halfway between grid positions (i.e. to print off-grid) the six pixels can be set to: B B G W G B (where G is a grey state, halfway between black and white).

It will be appreciated that, although FIGS. 7–8 show element arrays comprising controllable-tilt mirrors, arrays of different controllable elements may be used in alternative embodiments. For example, piston mirrors, or mirrors having a combination of piston and tilt function (so-called piston-tilt mirrors) may be used. With piston mirrors, a black pixel is created by a 180 degree phase difference (e.g., ¼λ height difference, passed two times in reflection to give 180 degrees) between neighbouring mirrors. This means that the pixel on the wafer is in fact obtained by the cooperative effort of two sub-resolution piston mirrors. The pixels can thus be seen as lying "in between" the mirrors. Both tilt and piston mirrors provide the freedom to project any desired pattern on the wafer and allow for grey scaling to move the pattern over the mirror grid. Thus, in this example it may not be necessarily a one-to-one mapping of a pixel on the target substrate to a mirror in the array of controllable elements. A pixel may be created by a combination of elements, such as piston mirrors.

Figure 3:
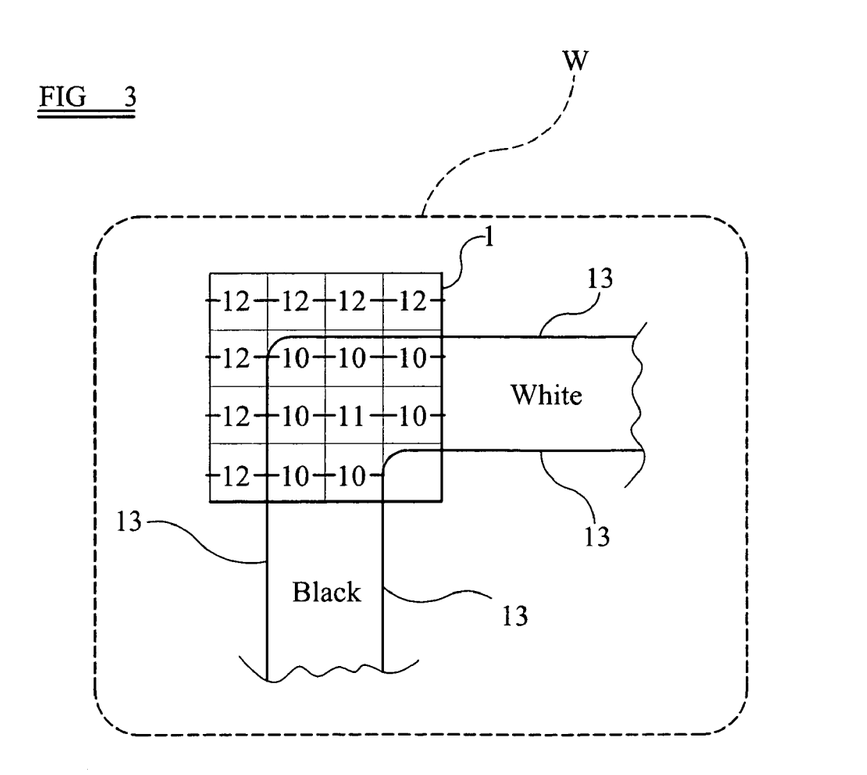
FIG. 3 illustrates part of a lithographic method, according to one embodiment of the present invention.

FIG. 3 illustrates part of a lithographic method, according to one embodiment of the present invention, which can be performed with apparatus such as that shown in FIG. 1. A dosage pattern of white and black regions is to be provided to the target surface of a resist layer of a substrate W. Part of the pattern is shown with the desired boundary between black and white regions being indicated by lines 13. A pattern 1 of pixels is being projected onto the target surface, each pixel corresponding to a respective controllable element in an array used to pattern a radiation beam prior to its projection. For simplicity, the pattern is shown to consist of just 16 pixels. In practice, the number of pixels may be in excess of a million. The pixels falling on the white region would normally be set to one of their grey intensity values, and those falling on the black regions would normally be set to black. However, pixel 11, which falls on the white region, corresponds to a defective element, and without compensation cannot deliver the desired dose. To compensate for this, the intensities of one or more of the neighboring pixels 10, falling on the same white region, are increased above the normal printing maximum. This is done by setting the corresponding non-defective elements to one of their white compensation states. Thus, compensation may be achieved within the white region, and without using pixels 12, which fall on the black regions.

It will be appreciated that the number and location of the selected pixels, and indeed the magnitude of the increased intensity of each selected pixel, may be calculated to give a desired compensation, and desired edge definition. Also, while a problem with conventional compensation techniques was that a compensation dose to an intended black region could not be undone, in the above embodiment of the present invention, the selective overdosing at a white location in one exposure step, to compensate for an adjacent defective pixel, can itself be compensated by reducing the dose given to the "overdosed" location in a subsequent step.

Figure 4:
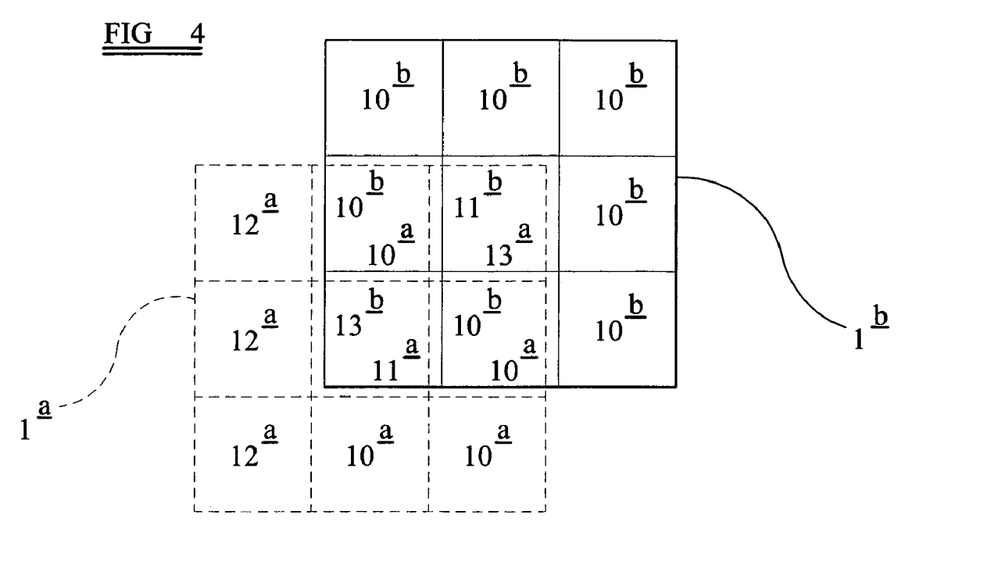
FIG. 4 illustrates defective pixel compensation steps used in a method according to one embodiment of the present invention.

FIG. 4 illustrates pre- and post-compensation in a two-pass method, according to an embodiment of the present invention. This is in contrast to FIG. 3, which illustrates an example of substantially simultaneous compensation using adjacent pixels in the same exposure step. In the embodiment of FIG. 4, during a first exposure step a pixel pattern 1a is projected onto a substrate, using a corresponding array of elements. In a second step, a second pixel pattern 1b is projected onto the substrate by the same array. The projected patterns overlap, but have been shifted so that no defective element can fall on the same part of the substrate twice. Again, only a small pattern (e.g., nine pixels) is shown to simplify the description. This simplification results in defective pixels from the first and second passes being adjacent each other (as described below). It is to be appreciated that this would not typically occur in practice, where an array may have in excess of one million elements, with fewer than 5 dead elements per million. A central element of the array is defective, such that corresponding pixels 11a, 11b of the first and second patterns are dead black pixels. However, they both fall on a white region of the target substrate. Thus, in the first step, to compensate for the subsequent underexposure of the target by dead pixel 11b in the second step, pixel 13a is arranged to have increased intensity (e.g., higher than the normal white-region printing intensity). Other pixels 10a of the first pattern falling on the white region are arranged to have the normal, lower white-printing intensity, and pixels 12a falling on black regions are arranged to have minimum intensity. Similarly, in the second step, to compensate for the preceding underexposure of the target by dead pixel 11a in the first step, pixel 13b is arranged to have increased intensity. The remaining non-defective pixels all fall on the white region and are arranged to have the normal, lower white-printing intensity.

Figure 5:
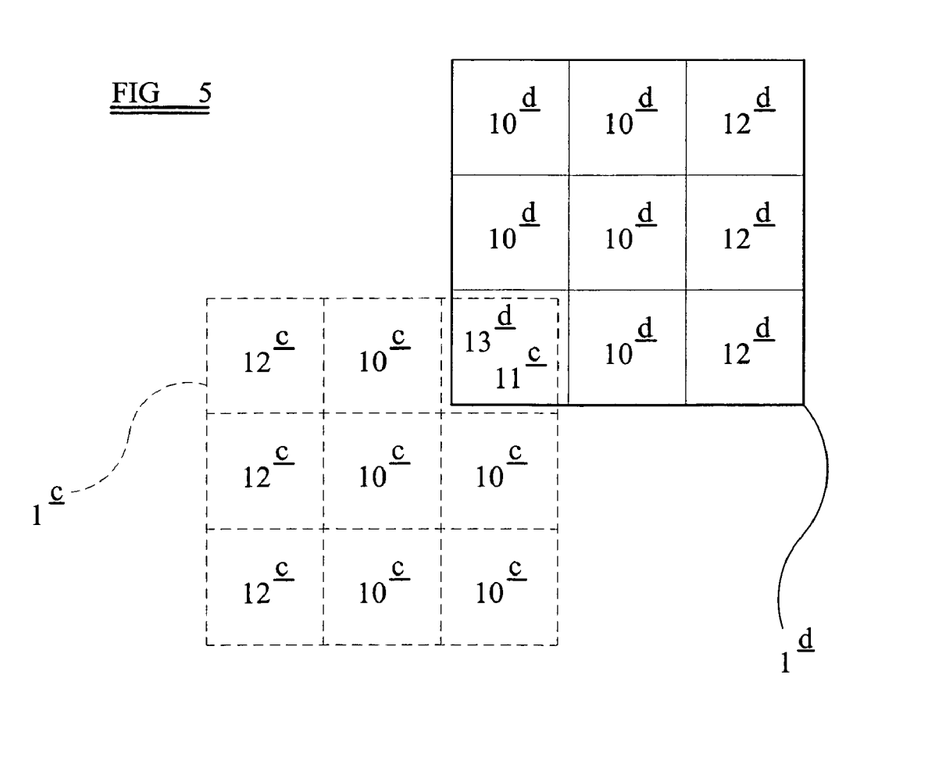
FIG. 5 illustrates further defective pixel compensation steps used in a method according to one embodiment of the present invention.

FIG. 5 illustrates a two-pass lithographic method employing post-compensation, according to one embodiment of the present invention. Here, a first pixel pattern 1c is projected in a first exposure step, using a first array of elements which includes a defective element, giving rise to defective pixel 11c. A second, overlapping pixel pattern 1d is projected in a second exposure step, using a second array having no defective elements. In the first step, pixels 12c are black, pixels 10c have normal white intensity, and pixel 11c is dead black, but was intended to be normal white. In the second step, compensation for previous dead black pixel 11c is achieved by making pixel 13d more intense, as compared with normal white pixels 10d. Pixels 12d in this example are black, as they fall outside the white region.

It will be appreciated that the simultaneous, pre- and post-compensation techniques illustrated by FIGS. 3, 4, and 5 may be used separately, or may be combined in a single method embodying the invention.

It will also be appreciated that in embodiments of the invention, although radiation doses greater than the normal printing doses are used for compensation, this does not preclude the additional use of normal printing doses (e.g., delivered by black or grey pixels) to contribute to the overall compensation. In general, the states of all of the functioning elements of an array are set, taking into account the known defective elements, to give a dosage pattern (e.g., intensity distribution). The given dosage pattern is set so that is optimally compensates for the effects of defective elements, while giving uniform feature sharpness (i.e., uniform dosage slope at feature edges, giving uniform edge definition). This uniformity is important so that nominally identical devices, formed at different positions on the substrate, will have the same characteristics (e.g., clocks running at the same speed). Thus, the element states are controlled to achieve compensation which, at a particular point, may not give the sharpest possible feature edge, but which results in uniform feature definition over the substrate.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A device manufacturing method, comprising:
   (a) patterning a projection beam of radiation with an array of individually controllable elements;
   (b) projecting the patterned projection beam onto a target portion of a substrate, the projected patterned projection beam comprising a plurality of pixels;
   (c) controlling the elements such that each pixel in the plurality of pixels delivers a first radiation dose to the target portion that is below or equal to a predetermined dose; and
   (d) controlling the elements such that at least one selected pixel in the plurality of pixels delivers a second radiation dose greater than the predetermined dose to compensate at least partially for at least one of:

(1) an effect of a defective element at a known position in the array of individually controllable elements on a pixel in the plurality of pixels adjacent the selected pixel, and (2) an underexposure of the target portion at a location corresponding to the selected pixel resulting from exposure of the location to a pixel in the plurality of pixels affected by a known defective element.

2. The method of claim 1, further comprising increasing said second radiation dose to a new dose larger than the predetermined dose by a factor of up to at least about 1.1.

3. The method of claim 1, further comprising increasing said second radiation dose to a new dose larger than the predetermined dose by a factor of up to at least about 1.5.

4. The method of claim 1, further comprising increasing said second radiation dose to a new dose larger than the predetermined dose by a factor of up to at least about 2.

5. The method of claim 1, further comprising:
delivering a predetermined radiation dosage pattern onto a target surface of the substrate, the dosage pattern comprising,
white regions onto which a radiation dosage at least equal to a predetermined threshold value is delivered, and
black regions onto which a radiation dosage less than said predetermined threshold value is delivered,
wherein step (c) comprises controlling said elements such that each pixel in the plurality of pixels projected onto one of the white regions delivers a radiation dose no greater than said predetermined dose; and
wherein step (d) comprises controlling the elements such that each said selected pixel is projected onto a white region and delivers an increased radiation dose to the white region to compensate at least partially for at least one of:
an effect of a defective element on a pixel adjacent the selected pixel on the same white region, and
an underexposure of the white region at the location of the selected pixel resulting from exposure of said location to a pixel affected by a defective element in another exposure step.

6. The method of claim 5, wherein the substrate comprises a layer of radiation sensitive material having an activation threshold, said predetermined threshold value is said activation threshold, and said target surface is a surface of the layer.

7. The method of claim 6, wherein the normal maximum dose is greater than the predetermined threshold value.

8. The method of claim 6, wherein the predetermined dose is in a range equal to or greater than half the predetermined threshold value and to less than the predetermined threshold value.

9. The method of claim 8, further comprising performing steps (c) and (d) twice to delivering the predetermined radiation dosage pattern to a target area of the target surface.

10. The method of claim 1, further comprising performing steps (c) and (d) first and second times to deliver a predetermined radiation dosage pattern to a target area of the substrate, wherein,
during performing of steps (c) and (d) the first time, the target area is exposed to a first plurality of said pixels corresponding to a first set of elements of a said array, and
during performing of steps (c) and (d) the second time, the target area is exposed to a second plurality of said pixels corresponding to a second, different set of elements of the same said array.

11. The method of claim 10, further comprising:
controlling the first set of elements such that the first plurality of pixels includes at least one selected pixel arranged to deliver an increased radiation dose to compensate at least partially for an underexposure effect of a defective element of the second set of elements.

12. The method of claim 10, further comprising:
controlling the second set of elements such that the second plurality of pixels includes at least one selected pixel arranged to deliver an increased radiation dose to compensate at least partially for an underexposure effect of a defective element of the first set of elements.

13. The method of claim 10, further comprising:
controlling the first set of elements such that the first plurality of pixels includes at least one selected pixel arranged to deliver an increased radiation dose to compensate at least partially for an underexposure effect of a defective element of the first set of elements.

14. The method of claim 10, further comprising:
controlling the second set of elements such that the second plurality of pixels includes at least one selected pixel arranged to deliver an increased radiation dose to compensate at least partially for an underexposure effect of a defective element of the second set of elements.

15. The method of claim 1, further comprising:
performing steps (c) and (d) first and second times to deliver a predetermined radiation dosage pattern to a target area of the substrate, wherein
during performing of steps (c) and (d) the first time, the target area is exposed to a first plurality of said pixels corresponding to a first set of elements of a first said array, and
during performing of steps (c) and (d) the second time, the target area is exposed to a second plurality of said pixels corresponding to a second set of elements of a second, different said array.

16. The method of claim 15, further comprising:
controlling the first set of elements such that the first plurality of pixels includes at least one selected pixel arranged to deliver an increased radiation dose to compensate at least partially for an underexposure effect of a defective element of the second set of elements.

17. The method of claim 15, further comprising:
controlling the second set of elements such that the second plurality of pixels includes at least one selected pixel arranged to deliver an increased radiation dose to compensate at least partially for an underexposure effect of a defective elemeht of the first set of elements.

18. The method of claim 15, further comprising:
controlling the first set of elements such that the first plurality of pixels includes at least one selected pixel arranged to deliver an increased radiation dose to compensate at least partially for an underexposure effect of a defective element of the first set of elements.

19. The method of claim 15, further comprising:
controlling the second set of elements such that the second plurality of pixels includes at least one selected pixel arranged to deliver an increased radiation dose to compensate at least partially for an underexposure effect of a defective element of the second set of elements.

20. The method of claim 1, wherein each pixel corresponds to a respective one of said elements.

21. The method of claim 20, wherein step (d) comprises controlling at least one selected element such that at least one corresponding selected pixel delivers an increased radiation dose.

22. The method of claim 20, wherein the array of elements includes a defective element at a known position, and step (d) comprises controlling at least one element immediately adjacent the defective element such that at least one corresponding pixel, immediately adjacent the pixel corresponding to the defective element, delivers an increased radiation dose to compensate at least partially for the effect of the defective element.

23. The method of claim 22, wherein the substrate has a target surface to which a predetermined radiation dosage pattern is to be delivered, the dosage pattern comprising nominal white regions, to which a radiation dosage at least equal to a predetermined threshold value is to be delivered, and nominal black regions, to which a radiation dosage less than said predetermined threshold value is to be delivered, and the step (d) comprises:
compensating for the effect of the defective element by controlling at least one adjacent element when the pixel corresponding to the defective element is projected onto a white region, such that a corresponding adjacent pixel that is projected onto a same white region delivers an increased radiation dose.

24. The method of claim 20, wherein step (d) comprises controlling a selected plurality of elements, such that a corresponding plurality of pixels deliver increased radiation doses to provide the compensation.

25. The method of claim 1, further comprising:
depending an intensity distribution of each pixel on a respective corresponding element in the array and on elements immediately adjacent the respective corresponding element.

26. The method of claim 1, wherein:
step (c) comprises controlling the elements such that each pixel has a peak intensity less than or equal to a predetermined normal maximum intensity; and
step (d) comprises controlling the elements such that said at least one selected pixel has an increased peak intensity higher than the normal maximum intensity.

27. The method of claim 26, further comprising increasing the peak intensity higher than the normal maximum intensity by up to at least a factor of about 1.5.

28. The method of claim 1, further comprising controlling each non-defective element to selectively adopt one of at least three states, said states comprising,
a nominal black state, in which the element interacts with the projection beam so as to make a minimum contribution to the radiation dose delivered by a corresponding pixel;
at least one nominal grey state, in which the element interacts with the projection beam so as to make an increased contribution to the radiation dose delivered by the corresponding pixel; and
at least one nominal white state, in which the element interacts with the projection beam so as to make a contribution to the radiation dose delivered to the corresponding pixel greater than that in any grey state,
wherein step (c) comprises controlling each element to adopt one of the black or grey states,
wherein step (d) comprises controlling at least one selected element to adopt a white state.

29. The method of claim 28, further comprising adjusting, based on the state of an element, a radiation dose delivered by the corresponding pixel by determining the contribution made by interaction of the element with the projection beam to the peak intensity of the corresponding pixel.

30. The method of claim 29, further comprising controlling each non-defective element to selectively adopt one of a series of grey states, each grey state corresponding to a respective contribution to a corresponding pixel's peak intensity.

31. The method of claim 30, further comprising controlling each non-defective element to selectively adopt one of a series of white states, each white state corresponding to a respective contribution to a corresponding pixel's peak intensity.

32. The method of claim 31, further comprising providing a whitest state as one of the plurality of white state in which the element interacts with the beam to provide a maximum contribution to the peak intensity of the corresponding pixel, the maximum contribution being at least twice as large as the largest contribution corresponding to a grey state.

33. The method of claim 1, further comprising performing an exposure step using steps (c) and (d).

34. A lithographic apparatus, comprising:
an illumination system that supplies a projection beam of radiation;
an array of individually controllable elements that patterns the projection beam;
a projection system that projects the patterned beam onto a target portion of a substrate, the patterned beam comprising a plurality of pixels, each pixel delivering a respective radiation dose to the target portion; and
a controller that controls said elements to selectively adopt one of at least three states, said states comprising,
a nominal black state in which the element interacts with the projection beam to make a minimum contribution to the radiation dose delivered by a corresponding pixel in the plurality of pixels,
at least one nominal grey state in which the element interacts with the projection beam as to make an increased contribution, compared to the nominal black state, to the radiation dose delivered by the corresponding pixel in the plurality of pixels, and
at least one nominal white state in which the element interacts with the projection beam to make a contribution to the radiation dose delivered to the corresponding pixel in the plurality of pixels greater than that in the at least one nominal grey state,
wherein the controller selectively controls the elements to adopt the at least one nominal white state to provide compensation for effects of one or more pixels of the plurality of pixels when the one or more pixels are defective.

35. The lithographic apparatus of claim 34, wherein each element, when operating normally, is controllable to selectively adopt one state in a plurality of grey states that includes the at least one nominal grey state.

36. The lithographic apparatus of claim 35, wherein each element, when operating normally, is controllable to selectively adopt one state in a plurality of white states that includes the at least one nominal white state.

37. The lithographic apparatus of claim 36, wherein:
the substrate has a target surface to which a predetermined radiation dosage pattern is to be delivered, the dosage pattern comprising nominal white regions, to which a radiation dosage at least equal to a predetermined threshold value is to be delivered, and nominal black regions, to which a radiation dosage less than said predetermined threshold value is to be delivered;

the plurality of grey states includes a maximum grey state in which said increased contribution is a maximum for the grey states;

the illumination system and the controller are used to expose the target portion to each pixel for a common exposure time; and the illumination system and the elements are used to expose the target portion for the common exposure time to a pixel whose corresponding element is in the maximum gray state delivers a dose at least equal to the predetermined threshold value.

38. The lithographic apparatus of claim 36, wherein:

the substrate has a target surface to which a predetermined radiation dosage pattern is to be delivered, the dosage pattern comprising nominal white regions, to which a radiation dosage at least equal to a predetermined threshold value is to be delivered, and nominal black regions, to which a radiation dosage less than said predetermined threshold value is to be delivered;

the plurality of grey states includes a maximum grey state in which said increased contribution is a maximum for the grey states;

the illumination system and that exposes the target portion to each pixel for a common exposure time;

the illumination system and the elements expose the target portion for the common exposure time to a pixel whose corresponding element is in the maximum gray state delivers a dose less than the predetermined threshold value but greater than half the predetermined threshold value.

39. The lithographic apparatus of claim 34, wherein the array of elements comprises a programmable mirror array.

* * * * *